US012677554B2

(12) United States Patent
Lee et al.

(10) Patent No.: US 12,677,554 B2
(45) Date of Patent: Jul. 7, 2026

(54) BENDING AREA SIGNAL WIRE AND DISPLAY DEVICE HAVING THE SAME

(71) Applicant: Samsung Display Co., LTD., Yongin-si (KR)

(72) Inventors: Dong Hyun Lee, Yongin-si (KR); Youn-Woong Kang, Yongin-si (KR); Si Joon Song, Yongin-si (KR); Jaehak Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 345 days.

(21) Appl. No.: 18/330,653

(22) Filed: Jun. 7, 2023

(65) Prior Publication Data

US 2024/0414963 A1 Dec. 12, 2024

(30) Foreign Application Priority Data

Jul. 26, 2022 (KR) ........................ 10-2022-0092716

(51) Int. Cl.
*H10K 59/131* (2023.01)
*H10K 59/80* (2023.01)
*H10K 102/00* (2023.01)

(52) U.S. Cl.
CPC ......... *H10K 59/131* (2023.02); *H10K 59/873* (2023.02); *H10K 2102/311* (2023.02)

(58) Field of Classification Search
CPC ............... H10K 59/131; H10K 59/873; H10K 2102/311; H10K 50/00; H10K 59/00; H10K 77/111; G09F 9/301; H10H 29/142; H10H 20/819; H10H 20/83; H10D 86/441; H10D 86/60; H10D 86/411; H10D 86/451

See application file for complete search history.

(56) References Cited

U.S. PATENT DOCUMENTS

| | | | |
|---|---|---|---|
| 10,566,554 B2 | 2/2020 | Li et al. | |
| 2021/0351263 A1* | 11/2021 | Okabe | H10K 59/8731 |
| 2021/0383729 A1* | 12/2021 | Liao | H01L 25/0753 |
| 2022/0005834 A1 | 1/2022 | Lee et al. | |
| 2022/0181423 A1 | 6/2022 | Lee et al. | |
| 2022/0367592 A1* | 11/2022 | Kanzaki | H10K 59/124 |

FOREIGN PATENT DOCUMENTS

| | | |
|---|---|---|
| KR | 102222680 B1 | 3/2021 |
| KR | 102291865 B1 | 8/2021 |
| KR | 1020220054708 A | 5/2022 |
| KR | 20220079760 A | 6/2022 |
| KR | 20220100555 A | 7/2022 |

* cited by examiner

*Primary Examiner* — J. E. Schoenholtz
(74) *Attorney, Agent, or Firm* — CANTOR COLBURN LLP

(57) ABSTRACT

A display device includes a display area including a display layer, a folding area extending from the display area and at which the display device is bendable, and a signal wire which is connected to the display layer and extends across the folding area. The signal wire includes within the folding area a first signal wire layer which crosses the folding area, a second signal wire layer which is on the first signal wire layer and electrically connected to the first signal wire layer, the second signal wire layer including a plurality of patterns spaced apart from each other along the signal wire, and a metal layer which is on the second signal wire layer and electrically connected to the second signal wire layer.

18 Claims, 14 Drawing Sheets

BENDING AREA SIGNAL WIRE AND DISPLAY DEVICE HAVING THE SAME

This application claims priority to Korean Patent Application No. 10-2022-0092716 filed on Jul. 26, 2022, and all the benefits accruing therefrom under 35 U.S.C. § 119, the entire contents of which are incorporated herein by reference.

BACKGROUND

(a) Field

The present disclosure relates to a display device.

(b) Description of the Related Art

Electronic devices based on mobility are widely used. In addition to small electronic devices such as mobile phones, tablet PCs have been widely used as mobile electronic devices.

Such a mobile electronic device includes a display device to provide visual information such as an image or a video to a user in order to support various functions. As components for driving the display device are down-sized, a proportion or area of a display area in the electronic device is gradually increasing.

SUMMARY

Embodiments are to provide a display device in which an area of a dead space occupied by a peripheral area is reduced.

An embodiment provides a display device including: a substrate including a display area and a folding area; a display layer overlapping the display area; a signal wire that extends from the display layer to cross the folding area; and a flexible printed circuit film electrically connected to the signal wire, where the signal wire includes a first signal wire positioned on the substrate, a second signal wire positioned on the first signal wire and that is electrically connected to the first signal wire, and a metal layer positioned on the second signal wire, the first signal wire crosses the folding area, and the second signal wire includes a (2-1)-th pattern and a (2-2)-th pattern spaced apart from each other in the folding area.

The first signal wire may include a (1-1)-th area adjacent to the display area, a (1-2)-th area adjacent to the flexible printed circuit film, and a first connection area that connects the (1-1)-th area and the (1-2)-th area.

A width of each of the (1-1)-th area and the (1-2)-th area may be greater than a width of the first connection area.

The (1-1)-th area, the connection area, and the (1-2)-th area may be arranged along one direction.

The (2-1)-th pattern may overlap the (1-1)-th area, and the (2-2)-th pattern may overlap the (1-2)-th area.

The metal layer may overlap the (2-1)-th pattern and the (2-2)-th pattern spaced apart from each other.

The display device may further include a resin layer positioned on the metal layer.

The resin layer may cover a plurality of the first signal wires and a plurality of the second signal wires.

The display device may further include an insulating layer positioned on the second signal wire, where the metal layer and the resin layer may be positioned within an opening of the insulating layer.

The display layer may include a first electrode, a second electrode overlapping the first electrode, a light emitting layer positioned between the first electrode and the second electrode, and a partition wall including an opening exposing a portion of the first electrode, and the insulating layer includes the same material as the partition wall.

Another embodiment provides a display device including: a substrate including a display area and a folding area; a display layer overlapping the display area; a signal wire that extends from the display layer to cross the folding area; and a flexible printed circuit film electrically connected to the signal wire, where the signal wire includes a first signal wire positioned on the substrate, a second signal wire positioned on the first signal wire and that is electrically connected to the first signal wire, and a metal layer positioned on the second signal wire, the first signal wire includes a (1-1)-th pattern and a (1-2)-th pattern spaced apart from each other in the folding area, and the second signal wire crosses the folding area.

The second signal wire may include a (2-1)-th area adjacent to the display area, a (2-2)-th area adjacent to the flexible printed circuit film, and a second connection area that connects the (2-1)-th area and the (2-2)-the area.

A width of each of the (2-1)-th area and the (2-2)-th area may be greater than a width of the second connection area.

The (2-1)-th area may overlap the (1-1)-th pattern, and the (2-2)-th area may overlap the (1-2)-th pattern.

The metal layer may overlap the second connection area.

The display device may further include a resin layer positioned on the metal layer.

The resin layer may cover a plurality of the first signal wires and a plurality of the second signal wires.

The display device may further include an insulating layer positioned on the second signal wire, where the metal layer and the resin layer may be positioned within an opening of the insulating layer.

The display layer may include a gate electrode positioned on the substrate, a source electrode and a drain electrode positioned on the gate electrode, a connection electrode positioned on the drain electrode, a first electrode positioned on the connection electrode, a second electrode overlapping the first electrode, a light emitting layer positioned between the first electrode and the second electrode, and a partition wall including an opening exposing a portion of the first electrode.

The first signal wire may include the same material as the gate electrode, and the second signal wire may include the same material as the connection electrode.

According to the embodiments, it is possible to provide a display device in which an area of a dead space occupied by a peripheral area is reduced.

BRIEF DESCRIPTION OF THE DRAWINGS

The above and other advantages and features of this disclosure will become more apparent by describing in further detail embodiments thereof with reference to the accompanying drawings, in which:

FIG. 4 illustrates an enlarged cross-sectional view of a display area according to an embodiment.

FIG. 6 illustrates an enlarged top plan view of signal wires disposed in a folding area according to an embodiment.

FIG. 12, FIG. 13 and FIG. 14 respectively illustrate enlarged cross-sectional views of a method of providing a display panel according to an embodiment.

DETAILED DESCRIPTION

Figure 1:
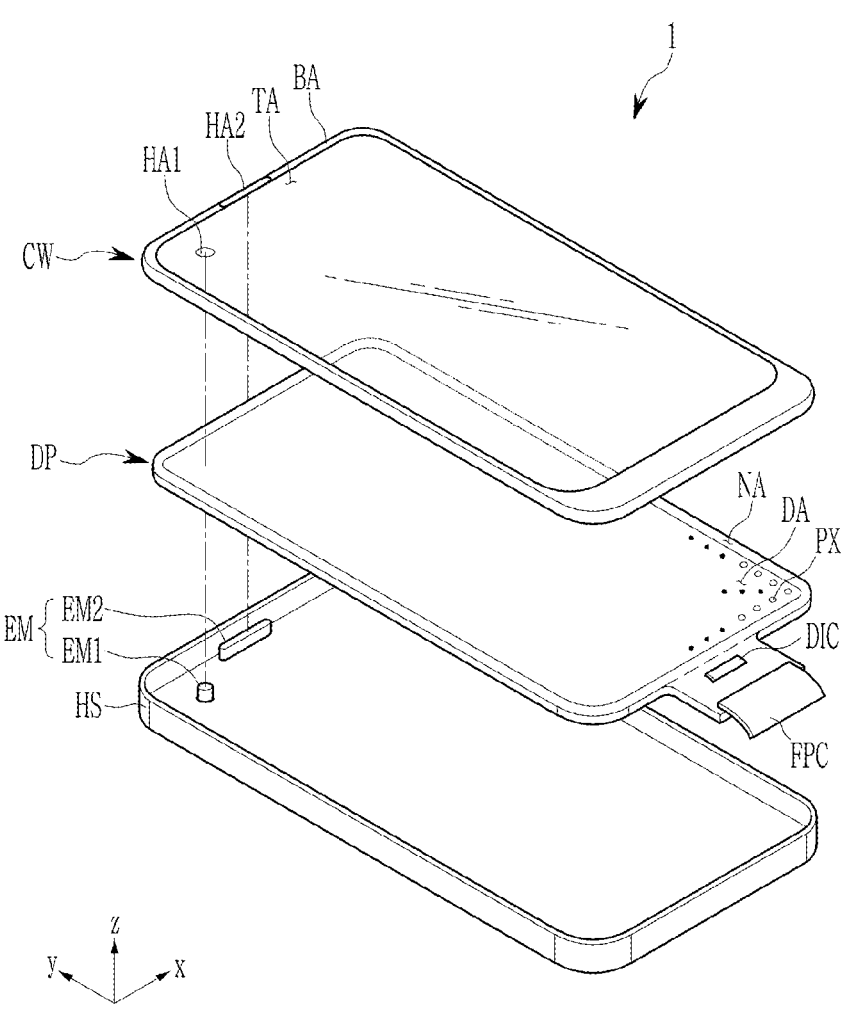
FIG. 1 illustrates a schematic exploded perspective view of a display device according to an embodiment.

The invention will be described more fully hereinafter with reference to the accompanying drawings, in which embodiments of the invention are shown. As those skilled in the art would realize, the described embodiments may be modified in various different ways, all without departing from the spirit or scope of the invention.

In order to clearly describe the invention, parts or portions that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, or substrate is referred to as being related to another element such as being "on" another element, it can be directly on the other element or intervening elements may also be present. In contrast, when an element is referred to as being related to another element such as being "directly on" another element, there are no intervening elements present.

Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. For example, a reference number labeling a singular form of an element within the drawing figures may be used to reference a plurality of the singular element within the text of specification. "At least one" is not to be construed as limiting "a" or "an." "Or" means "and/or." As used herein, the term "and/or" includes any and all combinations of one or more of the associated listed items.

In addition, unless explicitly described to the contrary, the word "comprise" and variations such as "comprises" or "comprising" will be understood to imply the inclusion of stated elements but not the exclusion of any other elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

In the accompanying drawings, signs "x", "y", and "z" are used to indicate directions. Here, "x" is a first direction, "y" is a second direction which may cross or be perpendicular to the first direction, and "z" is a third direction which may cross or be perpendicular to the first and second directions.

Figure 2:
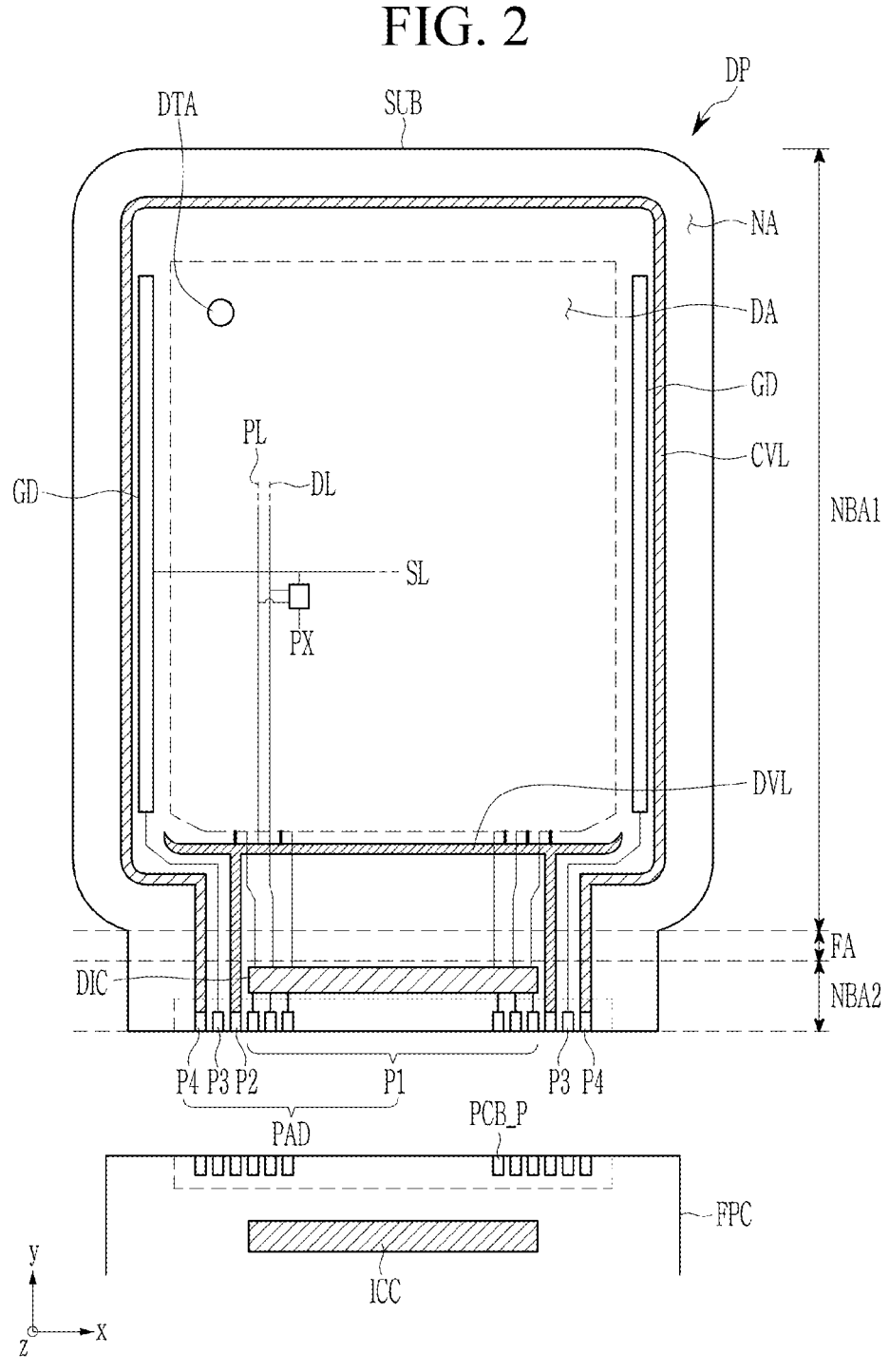
FIG. 2 illustrates a schematic top plan view of a display panel according to an embodiment.
Figure 3:
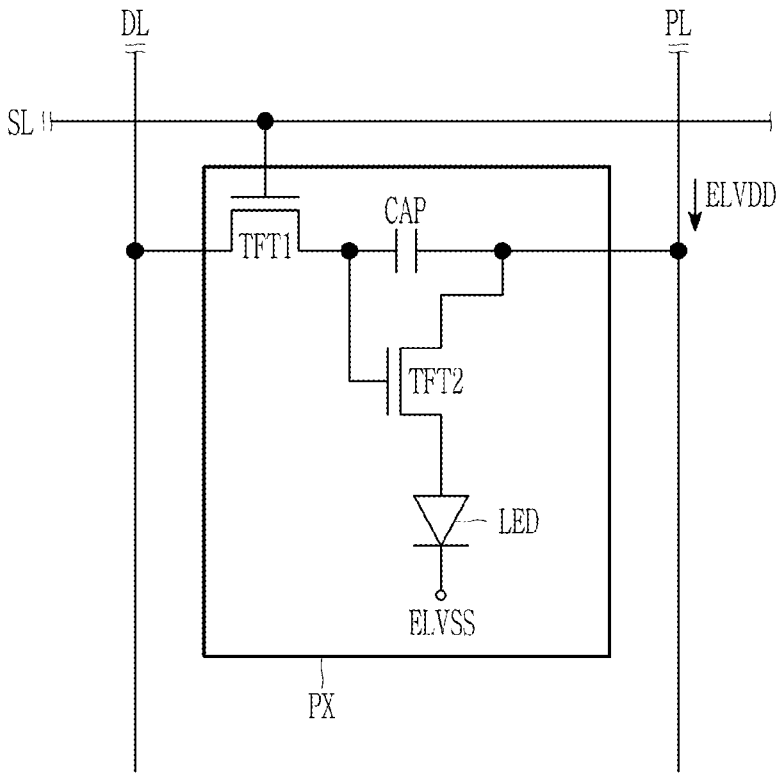
FIG. 3 illustrates an equivalent circuit diagram of one pixel according to an embodiment.
Figure 4:
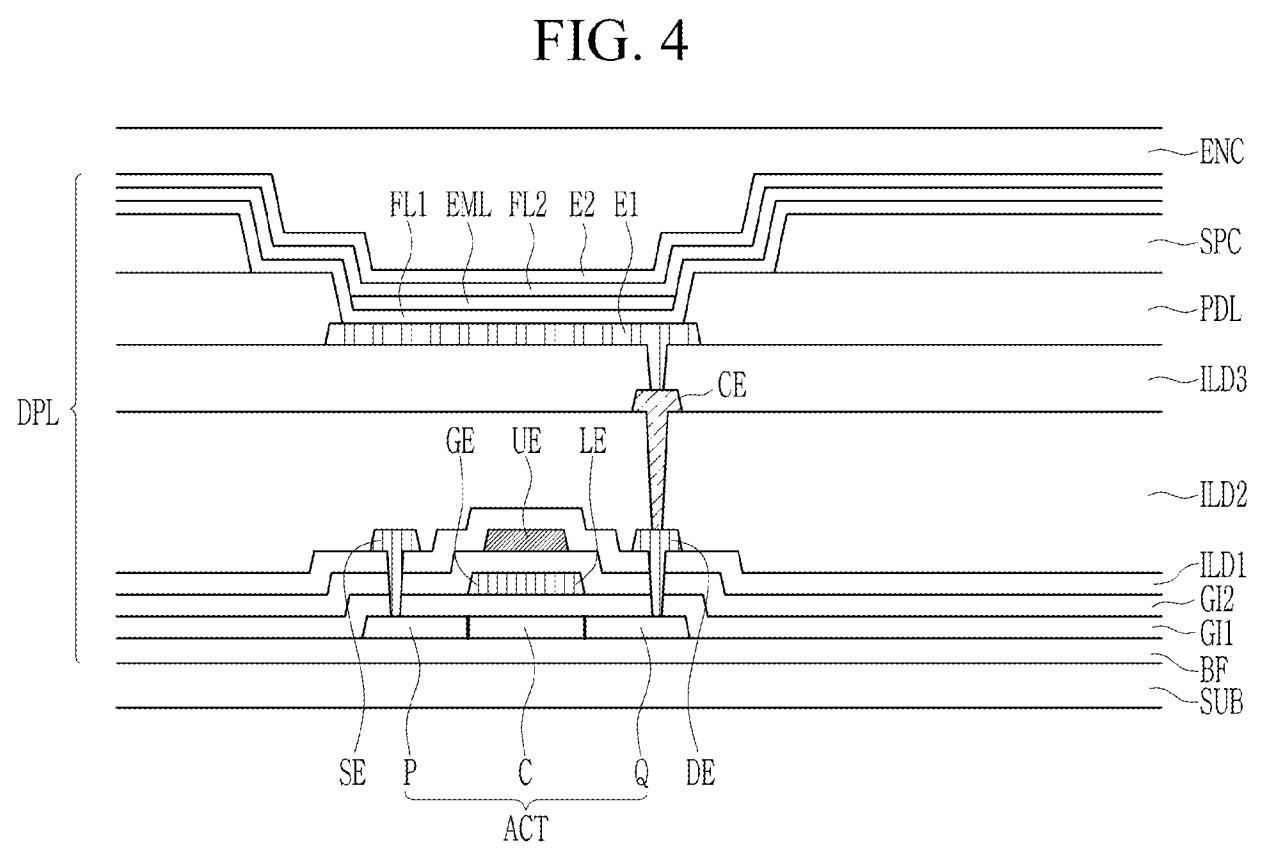

Hereinafter, a display device 1 according to an embodiment will be described with reference to FIG. 1 to FIG. 4. FIG. 1 illustrates a schematic exploded perspective view of a display device 1 according to an embodiment, FIG. 2 illustrates a schematic top plan view of a display panel DP according to an embodiment, FIG. 3 illustrates an equivalent circuit diagram of one pixel PX according to an embodiment, and FIG. 4 illustrates a cross-sectional view of constituent elements disposed in a display area DA according to an embodiment.

Referring to FIG. 1, a display device 1 may be applied to electronic devices such as smart phones, mobile phones, tablets, multimedia players, laptops, and game machines. The display device 1 may be rigid in a general sense. The display device 1 may include a flexible portion capable of bending, folding, rolling, and the like. The display device 1 may display an image in a third direction (z), and corresponding to a front surface in a plane defined by a first direction (x) and a second direction (y). The third direction may cross the first and second directions. The display device 1 may include a display panel DP, a cover window CW, an electronic module EM, and a housing HS.

The display panel DP may include a display area DA and a non-display area NA (e.g., a peripheral area). The display area DA is an area (e.g., a planar area) in which an image is displayed, and may correspond to a screen (e.g., a display screen of the display device 1). The non-display area NA is an area in which no image is displayed, and may surround at least a portion of the display area DA. The non-display area NA may be adjacent to the display area DA. Various components or layers of the display device 1 may include a display area DA and a non-display area NA corresponding to those described above.

The display panel DP may include pixels PX arranged in the display area DA, and an image may be displayed by a combination of the pixels PX (e.g., by combining light-emission at the pixels PX, driving of the pixels PX, etc.). The display panel DP may include pixel circuits and signal wires which are connected to the pixels PX, for driving the pixels PX. The display panel DP may be a light emitting display panel including light emitting diodes, and each light emitting diode may configure (or be included in) the pixel PX. The display panel DP may include a touch sensor layer capable of sensing an external input to the display device 1, such as sensing a touch, a proximity, etc. of an input tool.

In the non-display area NA of the display panel DP, a driving part that generates and/or processes various signals (e.g., electrical signals) for driving the pixels PX may be positioned. For example, the driving part may include a data driver DIC that applies a data voltage as an electrical signal to the pixels PX, a gate driver GD that applies a gate signal as an electrical signal to the pixels PX, and a controller that controls the data driver DIC and the gate driver GD. The gate driver GD may be integrated in the non-display area NA. The data driver DIC is provided in a form of an integrated circuit chip and mounted in the non-display area NA, that is, connected to the display panel DP at the non-display area NA. The data driver DIC and/or the controller may be disposed on a flexible printed circuit film FPC or the like which is electrically connected to the display panel DP at the non-display area NA, to be electrically connected to the display panel DP.

The cover window CW may be positioned on the display panel DP to protect the display panel DP from an external impact and the like, and to transmit an image displayed on the display panel DP to outside the display device 1. The cover window CW may be attached to the display panel DP by an adhesive such as an optically clear adhesive (OCA) or an optically clear resin (OCR). The cover window CW may be coated on the display panel DP. The cover window CW may include a transmission area TA and a blocking area BA (e.g., a light blocking area). The transmission area TA may be an optically transparent area, and may transmit incident light. The blocking area BA may be an area having lower light transmittance than the transmission area TA. The blocking area BA may define a shape (e.g., a planar shape) of the transmission area TA. The blocking area BA is adjacent to the transmission area TA, and may surround the transmission area TA, in a plan view (e.g., a view along the third direction). The blocking area BA may display or have a predetermined color. The blocking area BA overlaps (or corresponds to) the non-display area NA of the display panel DP to block the non-display area NA from being viewed from the outside (e.g., outside of the display device 1).

The cover window CW may include a first hole area HA1 and a second hole area HA2. Each of the first hole area HA1 and the second hole area HA2 may overlap the electronic module EM. The electronic module EM may operate by receiving external signals provided through the first hole area HA1 and the second hole area HA2.

The first hole area HA1 may be positioned in the transmission area TA, and the second hole area HA2 may be positioned in the blocking area BA. Unlike the illustrated example, the first hole area HA1 and the second hole area HA2 may be positioned in areas opposite to each other, or both of them may be positioned in the transmission area TA or the blocking area BA. In addition, the number of the hole areas may be variously changed. The first hole area HA1 may have a circular shape, and the second hole area HA2 may be formed to be extended in the first direction (x), but the shapes and sizes of them may be variously changed. As being extended in a direction, an element may have a major dimension along such direction, without being limited thereto.

In each of the first hole area HA1 and the second hole area HA2, a predetermined depression recessed from a rear surface of the cover window CW, may be defined. The depression may include a groove having a deeper depth than a thickness of the cover window CW. In an embodiment, a hole at a respective hole area may penetrate a thickness of the cover window CW, such as to be open at opposing surfaces of the cover window CW along the third direction (e.g., thickness direction), without being limited thereto.

The electronic module EM may include various functional modules related to the operation of the display device 1. The electronic module EM may be electrically connected to the display panel DP through a connector or the like. For example, the electronic module EM may include a camera, a sensor, a speaker, a microphone, and the like. The electronic module EM may include a first electronic module EM1 and a second electronic module EM2.

The first electronic module EM1 may sense a subject or object received through the first hole area HA1. The first electronic module EM1 may receive an external input transmitted through the first hole area HA1, or may provide an output through the first hole area HA1. The first electronic module EM1 may be a light emitting module, a light sensing module, and/or a photographing module. For example, the first electronic module EM1 may include at least one of a camera module for photographing a subject, a light emitting module for outputting infrared rays, and a CMOS sensor for detecting infrared rays.

The second electronic module EM2 may collect a sound signal such as voice through the second hole area HA2, or may provide a sound signal such as processed voice to the outside. For example, the second electronic module EM2 may include at least one of a sound input module and a sound output module. The sound input module may include a microphone capable of receiving a sound signal. The sound output module may include a speaker that outputs sound data as a sound signal.

Unlike as illustrated, the electronic module EM may be configured as a single module, may further include a larger number of electronic modules, and may be variously disposed.

The housing HS may be combined with the cover window CW to configure an appearance (e.g., outer surface) of the display device 1, and define an inner space of the display device 1. The housing HS may be made of (or include) a material with high rigidity, such as metal, glass, or plastic. The display panel DP and the electronic module EM may be positioned in an inner space of the display device 1 which is defined by the cover window CW and the housing HS.

Referring to FIG. 2, the display panel DP may include a substrate SUB, and the substrate SUB may include planar areas corresponding to the display area DA and the non-display area NA. In addition, the substrate SUB may include a first area NBA1, a second area NBA2, and a folding area FA (or a bending area) that are divided according to a degree that the substrate SUB (or the display panel DP or the display device 1) is bendable. The first region NBA1, the folding area FA, and the second area NBA2 may be disposed in this order. The substrate SUB may be bent based on the folding area FA, such as to be bendable or foldable at the folding area FA. The substrate SUB (or the display device 1 or the display panel DP) which is bent at the folding area FA may dispose the second area NBA2 on a rear surface of the first area NBA1. A plurality of signal wires to be described later may cross the folding area FA. For example, a plurality of signal wires electrically connected to a scan line SL, a data line DL, a driving voltage line PL, a driving voltage transmitting line DVL, a common voltage transmitting line CVL, and the like may cross the folding area FA.

The display panel DP may include the pixels PX, and the pixels PX may be disposed in the display area DA. Each pixel PX may include a light emitting diode and a pixel circuit which is connected thereto. Each pixel PX may emit a light as a light-emitting element, such as emitting red, green, blue, or white light.

The display panel DP may include the signal wires, a gate driver GD, a pad portion PAD as a pad area, and the like. The signal wires may include the scan line SL, the data line DL, the driving voltage line PL, the driving voltage transmitting line DVL, and the common voltage transmitting line CVL. The scan line SL may extend across the display area DA in the first direction (x). The data line DL and the driving voltage line PL may extend across the display area DA in the second direction (y). The driving voltage transmitting line DVL may be disposed in the non-display area NA. The driving voltage transmitting line DVL may be connected to the driving voltage lines PL, and may transmit a driving voltage $EL_{VDD}$. The common voltage transmitting line CVL may be disposed in the non-display area NA. The common voltage transmitting line CVL may extend along a boundary of the display area DA, to be disposed to surround the display area DA. The common voltage transmitting line CVL may transmit a common voltage $EL_{VSS}$ to an electrode of the light emitting diode LED configuring the pixel PX.

The gate driver GD may be positioned at both sides (e.g., each of opposing sides) of the display area DA in (or along) the first direction (x). The gate driver GD may generate a gate signal which is transmitted to the pixel PX through the scan line SL. The pad portion PAD may be disposed at one end of the display panel DP.

The pad portion PAD (e.g., a first pad portion) may include terminals P1, P2, P3, and P4 that may be arranged along the first direction (x). The terminals P1, P2, P3, and P4 may be electrically connected to terminals of a pad portion PCB_P (e.g., a second pad portion) of the flexible printed circuit film FPC. The flexible printed circuit film FPC may transmit a signal or power of a controller ICC to the display panel DP, through the pad portions PAD and PCB_P.

The controller ICC may convert an image signal inputted from the outside, into an image data signal which is transmitted to the data driver DIC through the terminal P1. The controller ICC may receive a vertical synchronization signal, a horizontal synchronization signal, and a clock signal, generate a control signal for controlling driving of the gate driver GD and the data driver DIC, and transmit such signals through the terminals P3 and P1. The controller ICC may supply a driving voltage to the driving voltage transmitting line DVL through the terminal P2. The controller ICC may supply the common voltage $EL_{VSS}$ to the common voltage transmitting line CVL through the terminal P4. The data driver DIC may be positioned in the non-display area NA. For example, the data driver DIC may be disposed between the display area DA and the pad portion PAD. The data driver DIC may be connected to the data lines DL, and may transmit a data voltage ($V_{DAT}$) to be applied to each pixel PX to the data line DL.

FIG. 3 illustrates a pixel PX that is electrically connected to one scan line SL, one data line DL, and one driving voltage line PL as an example. The configuration of the pixel PX is not limited thereto, and may be modified and implemented.

One pixel PX includes a light emitting diode LED. The light emitting diode LED may be a top light emitting diode or a bottom light emitting diode. The pixel PX indicated in FIG. 3 may represent a circuit portion which is connected to the light-emitting element and drives the light emitting diode LED. The pixel circuit (PX in FIG. 5) includes a first transistor TFT1 (or a switching transistor), a second transistor TFT2 (or a driving transistor), and a capacitor CAP.

The first transistor TFT1 outputs a data signal applied to the data line DL in response to a scan signal applied to the scan line SL. The capacitor CAP is charged with a voltage corresponding to the data signal received from the first transistor TFT1.

The second transistor TFT2 is connected to the light emitting diode LED. The second transistor TFT2 controls a driving current (e.g., an electrical driving current) flowing through the light emitting diode LED in response to an amount of charge stored in the capacitor CAP. The light emitting diode LED emits light during a period in which the second transistor TFT2 is turned on.

FIG. 4 illustrates an example of a cross-sectional structure of one pixel PX described in FIG. 3.

Referring to FIG. 4, a display panel DP according to an embodiment includes the substrate SUB. The substrate SUB may be disposed in both the display area DA and the non-display area NA. The substrate SUB may include an inorganic insulating material such as glass or an organic insulating material such as plastic such as a polyimide (PI). The substrate SUB may be single-layered or multi-layered. The substrate SUB may have a structure in which at least one base layer and at least one inorganic layer, which include polymer resins sequentially stacked, are alternately stacked. The substrate SUB according to the embodiment may have a structure including two base layers and an inorganic layer positioned between the two base layers.

The substrate SUB may have various degrees of flexibility. The substrate SUB may be a rigid substrate, or a flexible substrate that is bendable, foldable, or rollable.

A buffer layer BF may be disposed on the substrate SUB. The buffer layer BF blocks impurities from being transmitted from the substrate SUB to an upper layer of the buffer layer BF, particularly, to a semiconductor layer ACT, thereby preventing characteristic degradation of the semiconductor layer ACT and reducing stress. The buffer layer BF may include an inorganic insulating material such as a silicon nitride or silicon oxide, or an organic insulating material. A portion or all of the buffer layer BF may be omitted.

The semiconductor layer ACT is disposed on the buffer layer BF. The semiconductor layer ACT may include at least one of polycrystalline silicon and an oxide semiconductor. The semiconductor layer ACT includes a channel area (C), a first area (P), and a second area (Q). The first area (P) and the second area (Q) are disposed at both sides of the channel area (C), respectively. The channel area (C) may include a semiconductor with a small amount of impurity doped or a semiconductor with no impurity doped, and the first area (P) and the second area (Q) may include semiconductors with a large amount of impurity doped compared to the channel area (C). The semiconductor layer ACT may be formed of an oxide semiconductor, and in this case, a separate passivation layer (not shown) may be added to protect an oxide semiconductor material that is vulnerable to external environments such as high temperature.

A first gate insulating layer GI1 is positioned on the semiconductor layer ACT. The first gate insulating layer GI1 may be a single layer or multilayer including at least one of a silicon oxide ($SiO_x$), a silicon nitride ($SiN_x$), and a silicon oxynitride ($SiO_xN_y$).

A gate electrode GE and a lower electrode LE are positioned on the first gate insulating layer GI1. The gate electrode GE and the lower electrode LE may be in a same layer as each other. As being in a same layer, elements may be formed in a same process and/or as including a same material, elements may be respective portions of a same material layer, elements may be on a same layer by forming an interface with a same underlying or overlying layer, etc., without being limited thereto. In an embodiment, the gate electrode GE and the lower electrode LE may be integrally formed, such as to be portions of a same conductive pattern.

The gate electrode GE and the lower electrode LE may each be a single layer or multilayer in which metal films containing one of copper (Cu), a copper alloy, aluminum (Al), an aluminum alloy, molybdenum (Mo), a molybdenum alloy, titanium (Ti), and a titanium alloy are stacked. The gate electrode GE may overlap the channel area (C) of the semiconductor layer ACT.

A second gate insulating layer GI2 and an upper electrode UE may be positioned on the gate electrode GE, the lower electrode LE, and the first gate insulating layer GI1. The upper electrode UE and the lower electrode LE may together form a capacitor.

A first insulating layer ILD1 is positioned on the upper electrode UE. The first insulating layer ILD1 may be a single layer or multilayer including at least one of a silicon oxide ($SiO_x$), a silicon nitride ($SiN_x$), and a silicon oxynitride ($SiO_xN_y$).

A source electrode SE and a drain electrode DE are positioned on the first insulating layer ILD1. The source electrode SE and the drain electrode DE are connected to the first area (P) and the second area (Q) of the semiconductor layer ACT through a contact hole formed (or provided) in the first insulating layer ILD1, respectively.

The source electrode SE and the drain electrode DE may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may have a single-layered or multi-layered structure including them.

A second insulating layer ILD2 is positioned on the first insulating layer ILD1, the source electrode SE, and the drain electrode DE. The second insulating layer ILD2 may include an organic insulating material such as a general purpose polymer such as poly (methyl methacrylate) (PMMA) or polystyrene (PS), a polymer derivative having a phenolic group, a acryl-based polymer, an imide-based polymer, a polyimide, an acryl-based polymer, and a siloxane-based polymer. The second insulating layer ILD2 formed as a single layer is illustrated in the present specification, but the invention is not limited thereto, and may be formed as a multilayer.

A connecting electrode CE is disposed on the second insulating layer ILD2. The connecting electrode CE may be omitted according to embodiments. The connecting electrode CE may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may have a single-layered or multi-layered structure including them.

A third insulating layer ILD3 and a first electrode E1 are positioned on the second insulating layer ILD2. The first electrode E1 is connected to the connecting electrode CE through (or at) a contact hole of the third insulating layer ILD3, and is electrically connected to the drain electrode DE. However, the invention is not limited thereto, and an example in which the first electrode is electrically connected to the drain electrode DE through an additional connecting electrode together with the connecting electrode CE positioned on the third insulating layer ILD3 may be possible.

The first electrode E1 may include a metal such as silver (Ag), lithium (Li), calcium (Ca), aluminum (Al), magnesium (Mg), or gold (Au), and may also include a transparent conductive oxide (TCO) such as an indium tin oxide (ITO) or an indium zinc oxide (IZO). The first electrode E1 may be formed of a single layer including a metal material or a transparent conductive oxide, or a multilayer including them. For example, the first electrode E1 may have a triple-layered structure of indium tin oxide (ITO)/silver (Ag)/indium tin oxide (ITO).

A transistor configured of the gate electrode GE, the semiconductor layer ACT, the source electrode SE, and the drain electrode DE is connected to the first electrode E1 to supply a current (e.g., an electrical current) to the light emitting diode LED as a light-emitting element.

A partition wall PDL is positioned on the third insulating layer ILD3 and the first electrode E1. The partition wall PDL may be a solid material portion within a partition wall layer.

The partition wall PDL as the solid material portion of the partition wall layer overlaps at least a portion of the first electrode E1, and has (or defines) an opening of the partition wall layer which corresponds to or defines a light emitting region. The opening may have a planar shape substantially similar to that of the first electrode E1. The opening may have a circular shape in a plan view, but is not limited thereto, and may have various planar shapes such as a rhombus or an octagonal shape similar to a rhombus, a rectangular shape, a polygonal shape, and an elliptical shape.

The partition wall PDL may include an organic insulating material. Alternatively, the partition wall PDL may include an inorganic insulating material such as a silicon nitride, a silicon oxynitride, or a silicon oxide. Alternatively, the partition wall PDL may include an organic insulating material and an inorganic insulating material. In the embodiment, the partition wall PDL includes a light-blocking material, and may be provided in black. The light blocking material may include carbon black, carbon nanotubes, a resin or paste containing a black dye, metal particles such as nickel, aluminum, molybdenum, and an alloy thereof, a metal oxide particle (for example, chromium oxide), or a metal nitride particle (for example, chromium nitride). When the partition wall PDL includes a light blocking material, reflection of external light by metal structures disposed under the partition wall PDL may be reduced. However, the invention is not limited thereto. In another embodiment, the partition wall PDL may include a light transmitting organic insulating material without including a light blocking material.

A spacer SPC may be disposed on the partition wall PDL. The spacer SPC as a solid portion of a spacer layer, may include an organic insulating material such as a polyimide. Alternatively, the spacer SPC may include an inorganic insulating material such as a silicon nitride ($SiN_x$) or a silicon oxide ($SiO_2$), or may include an organic insulating material and an inorganic insulating material.

In the embodiment, the spacer SPC may include the same material as the partition wall PDL. The spacer SPC as the solid portion of the spacer layer may have (or define) an opening corresponding to the opening of the partition wall layer and/or to the light emitting region. In this case, the partition wall PDL and the spacer SPC may be formed together in a mask process using a half tone mask or the like. In the embodiment, the partition wall PDL and the spacer SPC may include different materials.

A light emitting layer EML of a light-emitting element is positioned on the first electrode E1. The light emitting layer EML may include an organic material and/or an inorganic material. The light emitting layer EML may generate predetermined colored light.

A first functional layer FL1 of the light-emitting element may be positioned between the light emitting layer EML and the first electrode E1, and a second functional layer FL2 of the light-emitting element may be positioned between the light emitting layer EML and the second electrode E2.

The first functional layer FL1 may include at least one of a hole injection layer (HIL) and a hole transporting layer (HTL), and the second functional layer FL2 may include at least one of an electron transporting layer (ETL) and an electron injection layer (EIL).

The first functional layer FL1 and the second functional layer FL2 may be integrally formed to entirely cover the substrate SUB, respectively. That is, one or more functional layer may extend out of the opening at the light emission area, and into a non-emission area adjacent to the light emission area, in a direction along the substrate SUB. Each of the first functional layer FL1 and the second functional layer FL2 may be formed to entirely cover the display area DA of the substrate SUB. That is, each of the first functional layer FL1 and the second functional layer FL2 may cover an entirety of the display area DA of the substrate SUB.

The second electrode E2 of the light-emitting element is positioned on the emission layer EML. The second electrode E2 may include a reflective metal including calcium (Ca), barium (Ba), magnesium (Mg), aluminum (Al), silver (Ag), gold (Au), nickel (Ni), chromium (Cr), lithium (Li), calcium (Ca), or molybdenum (Mo) or a transparent conductive oxide (TCO) such as an indium tin oxide (ITO) or an indium zinc oxide (IZO).

The first electrode E1, the emission layer EML, and the second electrode E2 may configure a light emitting diode LED. Here, the first electrode E1 may be an anode, which is a hole injection electrode, and the second electrode E2 may be a cathode, which is an electron injection electrode. However, the embodiment is not necessarily limited thereto, and a first electrode E1 may be a cathode and a second electrode E2 may be an anode, according to a driving method of the light emitting display device.

Holes and electrons are injected into the light emitting layer EML from the first electrode E1 and the second electrode E2, respectively, and light is emitted when excitons in which the injected holes and electrons are combined enter a ground state from an excited state.

In the present specification, the stacked structure from the buffer layer BF positioned on the substrate SUB to the second electrode E2 will be referred to as a display layer DPL or display element layer.

An encapsulation layer ENC may be positioned on the second electrode E2. The encapsulation layer ENC includes at least one inorganic layer and at least one organic layer, and may have a triple-layered structure including a first inorganic encapsulation layer, an organic encapsulation layer, and a second inorganic encapsulation layer. The encapsulation layer ENC may be for protecting the light emitting layer EML from moisture or oxygen that may be introduced from the outside. In some embodiments, the encapsulation layer ENC may have a structure in which an inorganic layer and an organic layer are sequentially further stacked. Although the embodiment including the encapsulation layer ENC has been described in the present specification, the invention is not limited thereto, and an encapsulation substrate made of a non-bending material may be included instead.

Figure 5:
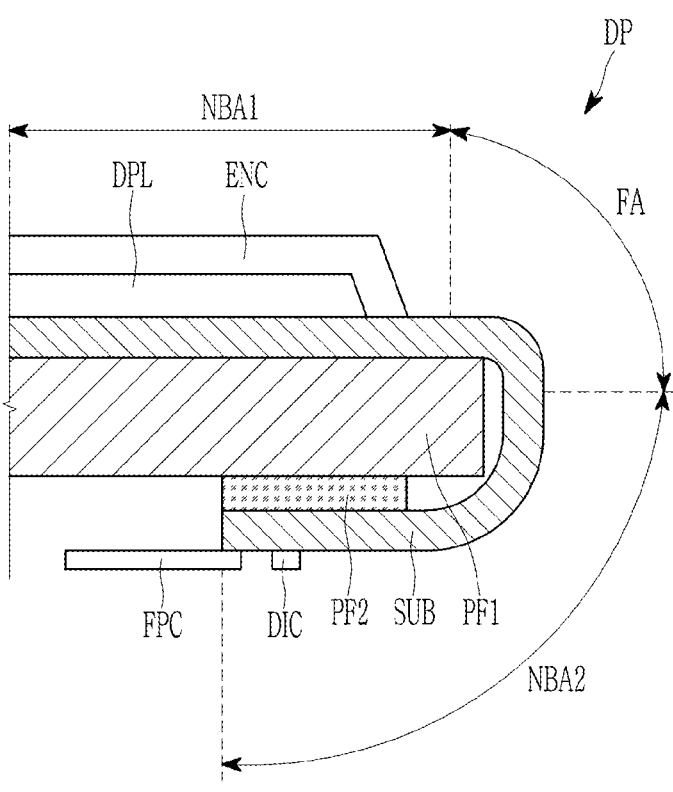
FIG. 5 illustrates an enlarged schematic cross-sectional view of a display panel according to an embodiment.
Figure 6:
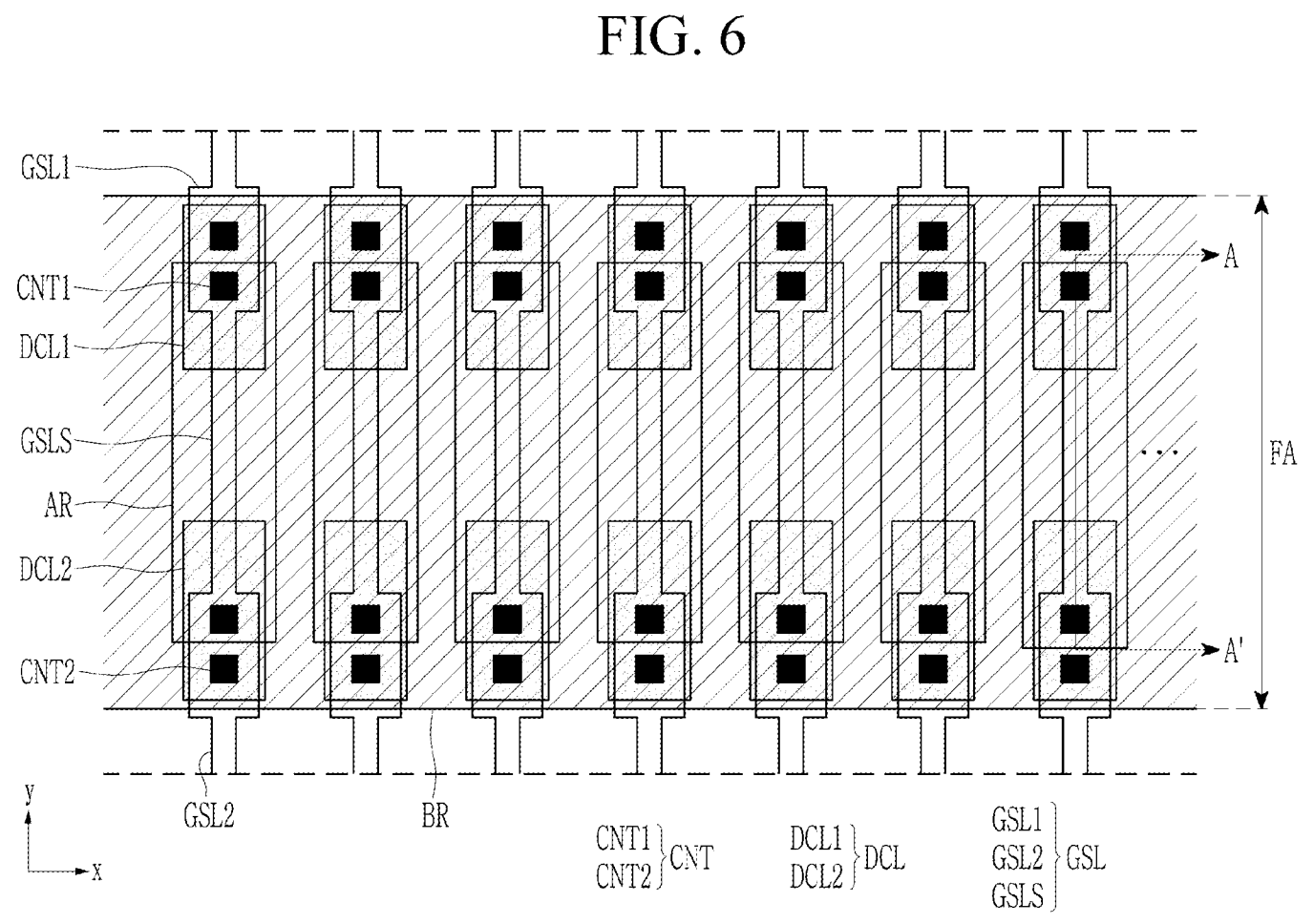
Figure 7:
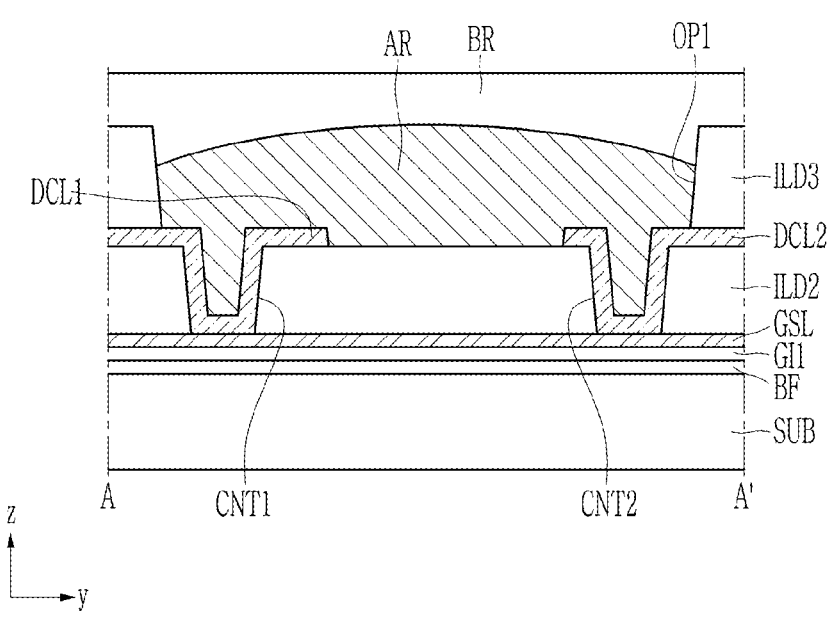
FIG. 7 illustrates an enlarged cross-sectional view taken along line A-A' of FIG. 6 according to an embodiment.
Figure 8:
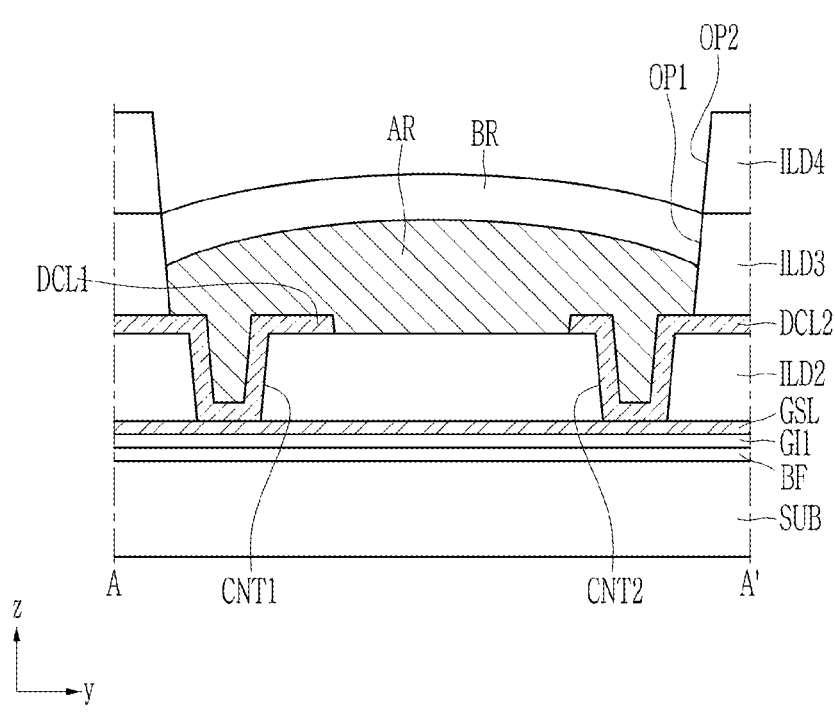
FIG. 8 illustrates an enlarged cross-sectional view taken along line A-A' of FIG. 6 according to an embodiment.

Hereinafter, a folding area FA of a non-display area NA of a display device 1 according to an embodiment will be specifically described with reference to FIG. 5 to FIG. 8. FIG. 5 illustrates a schematic cross-sectional view of a display panel DP according to an embodiment, FIG. 6 illustrates a top plan view of signal wires disposed in a folding area FA according to an embodiment, FIG. 7 illustrates a cross-sectional view taken along line A-A' of FIG. 6 according to an embodiment, and FIG. 8 illustrates a cross-sectional view taken along line A-A' of FIG. 6 according to an embodiment.

As described above with reference to FIG. 2, the display panel DP may include the first area NBA1, the folding area FA, and the second area NBA2 that are disposed in order along the second direction (y). The display panel DP may be foldable such as to be folded based on a folding axis parallel to the first direction (x). Particularly, as shown in FIG. 5, in the display panel DP which is folded at the folding area FA, the folding area FA may have a shape in which the substrate SUB is bent close to about 90 degrees, but the invention is not limited thereto. In addition to being bent at the folding area FA, the substrate SUB may be bent once more in the second area NBA2, and a curvature radius of the bending part of the substrate SUB in the second area NBA2 and a curvature radius of the substrate SUB in the folding area FA, may be different from each other.

The display layer DPL in which a plurality of pixels PX are disposed, and the encapsulation layer ENC, may be positioned in the first area NBA1. The display layer DPL and the encapsulation layer ENC have been described above with reference to FIG. 4, so detailed descriptions thereof will be omitted herein.

The display panel DP according to the embodiment may include a first passivation layer PF1 and a second passivation layer PF2 positioned on a rear surface of the substrate SUB. The first passivation layer PF1 may be disposed on the rear surface of the substrate SUB overlapping the first area NBA1, and the second passivation layer PF2 may be positioned on the rear surface of the substrate SUB overlapping the second area NBA2.

The first passivation layer PF1 and the second passivation layer PF2 may block moisture and oxygen flowing into the substrate SUB from the outside, or absorb an impact to the display panel DP. The first passivation layer PF1 and the second passivation layer PF2 may be provided in a form of a film or a resin, but are not limited thereto.

Hereinafter, a plurality of signal wires disposed in the folding area will be described with reference to FIG. 6 and FIG. 7. The signal wire described with reference to FIG. 6 and FIG. 7 may be the signal wire crossing the folding area FA described with reference to FIG. 2, and for example, may be at least one of the signal wires connected to the common voltage transmitting line CVL, connected to the gate driver GD, connected to the driving voltage transmitting line DVL, and connected to the data line DL.

Referring to FIG. 6 and FIG. 7, the buffer layer BF and the first gate insulating layer GI1 extending from the display area DA may be positioned on the substrate SUB, in the folding area FA. In some embodiments, at least a portion of the buffer layer BF and the first gate insulating layer GI1 may be omitted.

A first signal wire GSL positioned on the same layer as the gate electrode GE positioned in the display area DA, may be positioned on the first gate insulating layer GI1. The first signal wire GSL may include the same material as the gate electrode GE (in FIG. 4). The first signal wire GSL may be formed in the same process as the gate electrode GE (in FIG. 4). However, the invention is not limited thereto, and the first signal wire GSL may include the same material as the upper electrode UE (in FIG. 4) positioned in the display area DA, and may be formed in the same process as the upper electrode UE (in FIG. 4).

The first signal wire GSL may substantially extend along the y-direction. The first signal wire GSL may cross the folding area FA.

The first signal wire GSL may include a plurality of first signal wire portions including a (1-1)-th area GSL1, a (1-2)-th area GSL2, and a first connection area GSLS. The (1-1)-th area GSL1 may be electrically connected to a signal line extending from the display area DA, and is relatively adjacent to the display area DA. As being relatively adjacent, the (1-1)-th area GSL1 may be a first signal wire portion which is closest to the display area DA among the plurality of first signal wire portions. The (1-2)-th area GSL2 may be electrically connected to the flexible printed circuit film FPC, and may be relatively adjacent to the flexible printed circuit film FPC. The connection area GSLS may be positioned between the (1-1)-th area GSL1 and the (1-2)-th area GSL2, and may connect the (1-1)-th area GSL1 and the (1-2)-th area GSL2. In an embodiment, the (1-1)-th area GSL1, the connection area GSLS, and the (1-2)-th area GSL2 are arranged along one direction, such as to be arranged along a same virtual line (e.g., linearly arranged).

Each of the (1-1)-th area GSL1 and the (1-2)-th area GSL2 may include an extension having a width greater than that of a remainder of the first connection area GSLS. The first connection area GSLS overlapping an area at which the substrate SUB is folded may be formed to have a relatively small width in a direction corresponding to the folding axis, thereby preventing cracks or lifting of the first connection area GSLS. However, the shapes of the (1-1)-th area GSL1, the (1-2)-th area GSL2, and the connection area GSLS are not limited thereto, and may be variously modified according to embodiments.

The first signal wire GSL may be cut or disconnected by folding of the substrate SUB close to the vertical, but portions of the first signal wire GSL may remain electrically connected to each other, by a second signal wire DCL together with a metal layer AR, which will be described later. In addition, a process of evaluating reliability or of inspection of the display area DA by the first signal wire GSL may be performed before folding the substrate SUB during a process of manufacturing (or providing) the display device 1.

The second Insulating layer ILD2 of the non-display area NA may be positioned on the first signal wire GSL. The second insulating layer ILD2 may include the same material as the second insulating layer ILD2 (in FIG. 4) positioned in the display area DA, and may be formed in the same process.

The second signal wire DCL may be positioned on the second insulating layer ILD2. The second signal wire DCL may be formed in the form of an island or a discrete shape.

The second signal wire DCL may include a plurality of second signal wire portions spaced apart from each other in a direction along the substrate SUB.

The second signal wire DCL may overlap a portion of the first signal wire GSL. Particularly, the second signal wire DCL may overlap the extensions of the (1-1)-th area GSL1 and the (1-2)-th area GSL2. A portion of the second signal wire DCL may overlap the first connection area GSLS. The second signal wire DCL is shown as a rectangular shape in a plan view, but is not limited thereto, and may be provided in any shape overlapping the first signal wire GSL. The second signal wire DCL may overlap two different width portions of the first signal wire GSL, without being limited thereto.

The second signal wire DCL may include a (2-1)-th pattern DCL1 as a second signal wire portion overlapping the (1-1)-th area GSL1 and a (2-2)-th pattern DCL2 as a second signal wire portion overlapping the (1-2)-th area GSL2. The (2-1)-th pattern DCL1 and the (2-2)-th pattern DCL2 may be spaced apart from each other along the second direction (y). Since the second signal wire DCL has a separated shape in the folding area FA, even when the substrate SUB is folded, possibilities of the second signal wire DCL being cut, cracking or lifting are low.

The display device 1 according to the embodiment may include a plurality of (2-1)-th patterns DCL1 and a plurality of (2-2)-th patterns DCL2. The plurality of (2-1)-th patterns DCL1 may be disposed along the first direction (x), and the plurality of (2-2)-th patterns DCL2 may be disposed along the first direction (x). The plurality of (2-1)-th patterns DCL1 may be spaced apart from each other along the first direction (x), and the plurality of (2-2)-th patterns DCL2 may be spaced apart from each other along the first direction (x).

The second signal wire DCL in the non-display area NA may include the same material as the connection electrode CE (of FIG. 4) positioned in the display area DA. The second signal wire DCL may be formed through the same process as the connection electrode CE (of FIG. 4). However, the invention is not limited thereto, and the second signal wire DCL may be formed in the same process while including the same material as the source electrode SE (of FIG. 4) and the drain electrode DE (of FIG. 4).

The second signal wire DCL may be connected to the first signal wire GSL through (or at) contact holes CNT defined in or by the second insulating layer ILD2. Specifically, the (2-1)-th pattern DCL1 may be electrically connected to the (1-1)-th area GSL1 through a contact hole CNT1 (e.g., a first contact hole). The (2-2)-th pattern DCL2 may be electrically connected to the (1-2)-th area GSL1 through a contact hole CNT2 (e.g., a second contact hole).

The third insulating layer ILD3 may be positioned on the second signal wire DCL and the second insulating layer ILD2, in the non-display area NA. The third insulating layer ILD3 in the non-display area NA may include the same material as the third insulating layer ILD3 (in FIG. 4) positioned in the display area DA, and may be formed in the same process.

The third insulating layer ILD3 may expose a portion of the second signal wire DCL to outside the third insulating layer ILD2. The third insulating layer ILD3 may expose a portion of the (2-1)-th pattern DCL1 and a portion of the (2-2)-th pattern DCL2, to outside the third insulating layer ILD3.

The metal layer AR may be commonly positioned on the third insulating layer ILD3, the second signal wire DCL, and the second insulating layer ILD2. The metal layer AR may include a metal paste, a metal ink, a metal-organic decomposition (MOD), or a metal. The metal layer AR may include, for example, Ag, Ni, Au, or the like. Resistivity of the metal material included in the metal layer AR may be 10 microohm centimeter (μΩ·cm) or less, and adherence thereof may be about 5B, but the invention is not limited thereto. The metal layer AR may be formed by using an inkjet process, a sputtering process, or the like, and may be cured by using UV curing, light curing, or near-infrared curing processes.

The metal layer AR may be positioned in an opening OP1 as a first opening defined in or by solid portions of the third insulating layer ILD3. The metal layer AR may have a convex upper surface depending on the material forming the metal layer AR, and may have a flat upper surface according to another embodiment.

The metal layer AR may contact the (2-1)-th pattern DCL1 and the (2-2)-th pattern DCL2 exposed by the third insulating layer ILD3. The metal layer AR may electrically connect the (2-1)-th pattern DCL1 and the (2-2)-th pattern DCL2 spaced apart from each other. In an embodiment, the metal layer AR, together with the first signal wire GSL and the second signal wire DCL, may constitute a portion of a signal wire in the folding area FA (e.g., a folding area signal wire portion).

A resin layer BR may be positioned on the third insulating layer ILD3 and the metal layer AR. The resin layer BR may include an organic material or an inorganic material including at least one of an acryl-based compound, an epoxy-based compound, a urethane-based compound, a fluorine-based compound, and Si. The resin layer BR may be formed by using an inkjet process or a dispenser.

The resin layer BR may cover all of the plurality of first signal wires GSL, the plurality of second signal wires DCL, and the metal layer AR. The resin layer BR may be integrally formed while entirely covering the folding area FA, that is, covering an entirety of the folding area FA. However, the invention is not limited thereto, and the resin layer BR may be formed separately into a plurality of areas. The resin layer BR may prevent moisture and foreign particles from penetrating into the folding area FA.

In an embodiment, a folding area FA extends from the display area DA, and a signal wire is connected to the display layer DPL and extends across the folding area FA. The signal wire includes within the folding area FA, a first signal wire layer (e.g., a first signal wire GSL) which crosses the folding area FA, a second signal wire layer (e.g., the second signal wire DCL) which is on the first signal wire layer and electrically connected to the first signal wire layer, the second signal wire layer including a plurality of patterns (e.g., the (2-1)-th pattern DCL1 and the (2-2)-th pattern DCL2) spaced apart from each other along the signal wire, and a metal layer AR which is on the second signal wire layer and electrically connected to the second signal wire layer.

According to the embodiment, a plurality of signal wire portions positioned in the folding area FA of the non-display area NA may be electrically connected to each other through the first signal wire GSL, the second signal wire DCL, and the metal layer AR as a folding area signal wire. When the folding area FA is folded to be close to a right angle, the first signal wire GSL may be cut or disconnected in a partial area thereof. Since the second signal wire DCL has a separated shape in the folding area FA, probability of an additional cut or crack in the second signal wire DCL is low, and the spaced second signal wires DCL may remain electrically connected by using the metal layer AR having excellent relative flexibility. Accordingly, through the above-described embodiment, even when the substrate SUB is folded, cracks and lifts of the metal wires are prevented, and a dead space of the non-display area NA may be reduced by folding the substrate SUB at a specific angle.

Referring to FIG. 8, the display device 1 according to the embodiment may further include a fourth insulating layer ILD4 positioned on the third insulating layer ILD3, in the folding area FA of the non-display area NA. The fourth insulating layer ILD4 may be formed in the same process while including the same material as the partition wall PDL (of FIG. 4) positioned in the display area DA. The fourth insulating layer ILD4 may include an opening OP2 as a second opening exposing the metal layer AR.

The resin layer BR may be positioned in the opening OP2 of the fourth insulating layer ILD4 and the opening OP1 of the third insulating layer ILD3, which are overlapped or aligned with each other. The opening OP2 of the fourth insulating layer ILD4 and the opening OP1 of the third insulating layer ILD3 may prevent the resin material from overflowing during the process of forming the resin layer BR.

Figure 9:
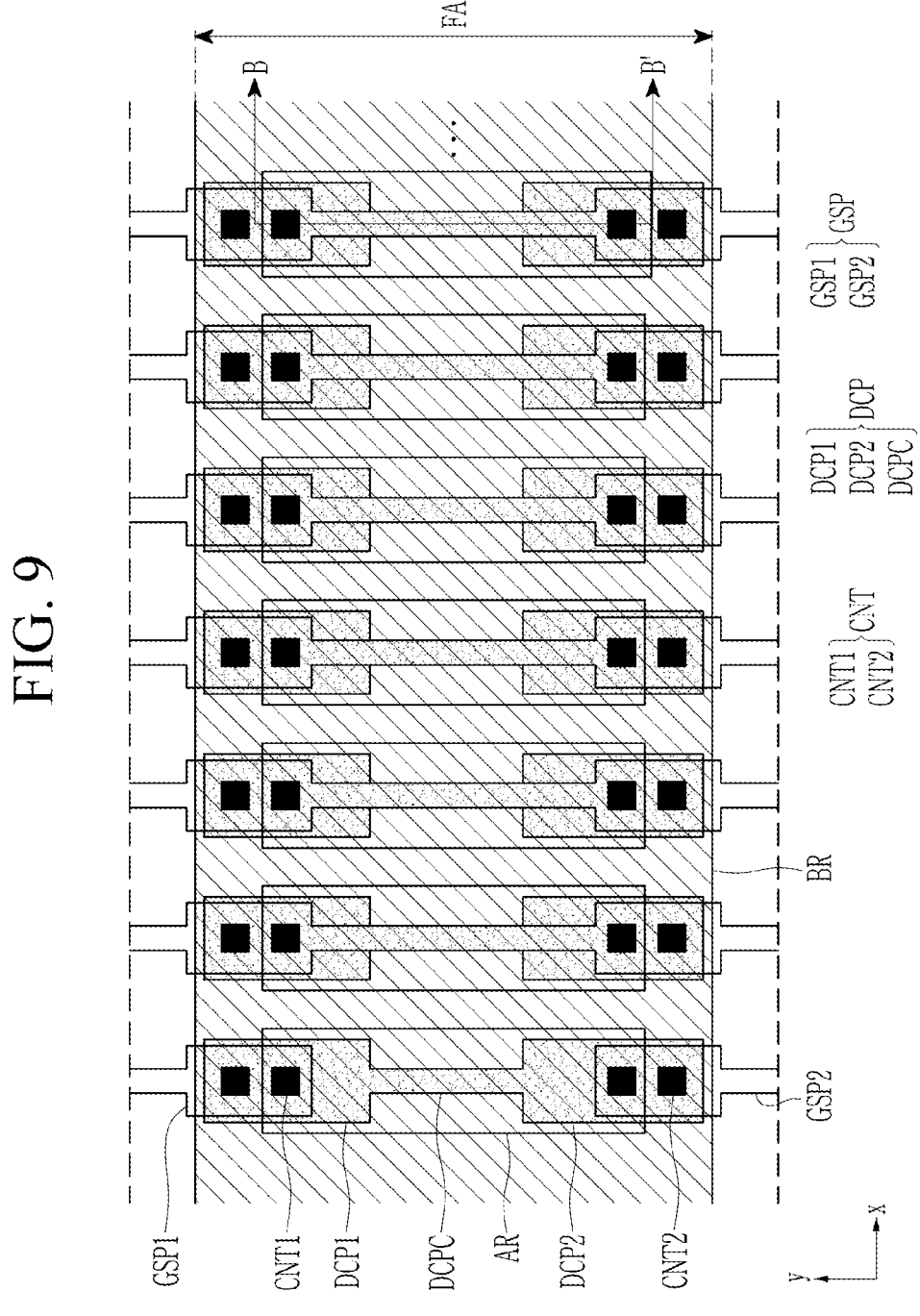
FIG. 9 illustrates an enlarged top plan view of signal wires disposed in a folding area according to an embodiment.
Figure 10:
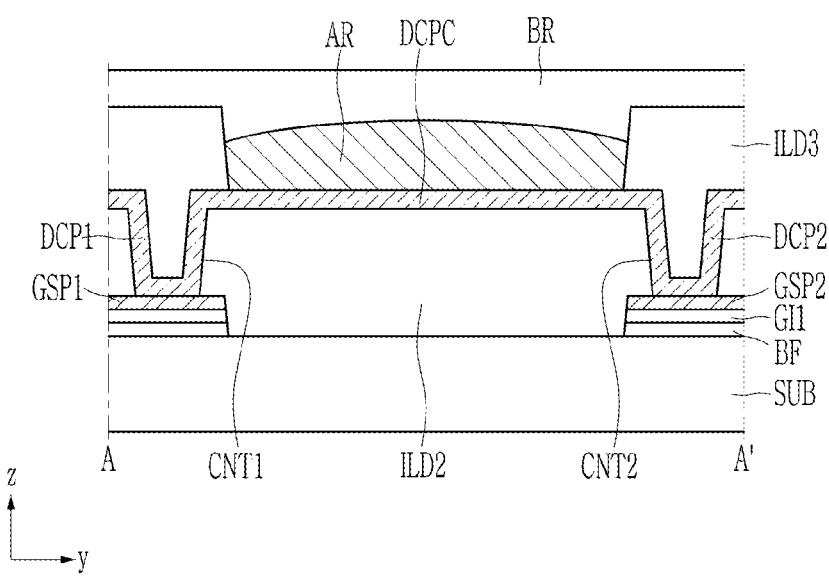
FIG. 10 illustrates an enlarged cross-sectional view taken along line B-B' of FIG. 9 according to an embodiment.
Figure 11:
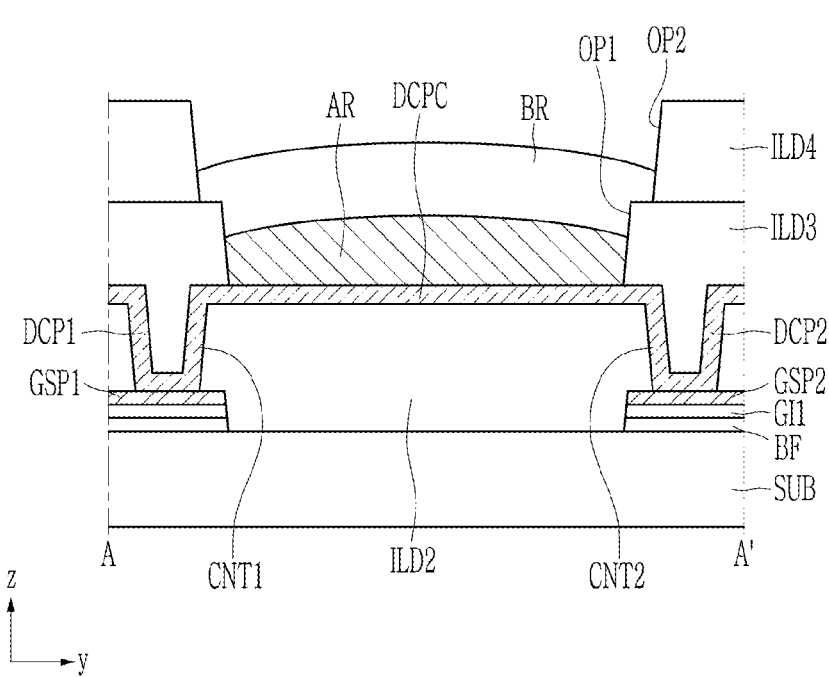
FIG. 11 illustrates an enlarged cross-sectional view taken along line B-B' of FIG. 9 according to an embodiment.

Hereinafter, a peripheral area of a display device 1 according to an embodiment will be described with reference to FIG. 9 to FIG. 11. FIG. 9 illustrates a top plan view of signal wires disposed in a folding area FA according to an embodiment, FIG. 10 illustrates a cross-sectional view taken along line B-B' of FIG. 9 according to an embodiment, and FIG. 11 illustrates a cross-sectional view taken along line B-B' of FIG. 9 according to an embodiment. Descriptions of the same constituent elements as those of the embodiment described above will be omitted.

First, signal wires positioned in the folding area FA will be described with reference to FIG. 9 and FIG. 10. The signal wire described with reference to FIG. 9 and FIG. 10 may be the signal wire crossing the folding area FA described with reference to FIG. 2, and for example, may be at least one of the signal wires connected to the common voltage transmitting line CVL, connected to the gate driver GD, connected to the driving voltage transmitting line DVL, and connected to the data line DL.

The buffer layer BF and the first gate insulating layer GI1 extending from the display area DA, may be positioned on the substrate SUB. In some embodiments, the buffer layer BF and the first gate insulating layer GI1 may have a form in which an area overlapping at least a part of the folding area FA is removed.

A first signal wire GSP positioned on the same layer as the gate electrode GE (of FIG. 1) positioned in the display area DA may be positioned on the first gate insulating layer GI1. The first signal wire GSP may include the same material as the gate electrode GE (of FIG. 4). The first signal wire GSP may be formed in the same process as the gate electrode GE (of FIG. 4). However, the invention is not limited thereto, and the first signal wire GSP may include the same material as the upper electrode UE (of FIG. 4) positioned in the display area DA, and may be formed in the same process as the upper electrode UE (of FIG. 4).

The first signal wire GSP may include a (1-1)-th pattern GSP1 and a (1-2)-th pattern GSP2. The (1-1)-th pattern GSP1 may be electrically connected to a signal line extending from the display area DA. The (1-2)-th pattern GSL2 may be electrically connected to the flexible printed circuit film FPC, and may be relatively adjacent to the flexible printed circuit film FPC. The (1-1)-th pattern GSP1 and the (1-2)-th pattern GSP2 may be spaced apart from each other along the second direction (y).

The display device 1 according to the embodiment may include a plurality of (1-1)-th patterns GSP1 and a plurality of (1-2)-th patterns GSP2. The plurality of (1-1)-th patterns GSP1 may be disposed along the first direction (x), and the plurality of (1-2)-th patterns GSP2 may be disposed along the first direction (x). The plurality of (1-1)-th patterns GSP1 may be spaced apart from each other along the first direction (x), and the plurality of (1-2)-th patterns GSP2 may be spaced apart from each other along the first direction (x).

The second insulating layer ILD2 may be positioned on the first signal wire GSP. The second insulating layer ILD2 may include the same material as the second insulating layer ILD2 (of FIG. 4) positioned in the display area DA, and may be formed in the same process.

A second signal wire DCP may be positioned on the second insulating layer ILD2. The second signal wire DCP may substantially extend along the y-direction. The second signal wire DCP may cross the folding area FA.

The second signal wire DCP may include a (2-1)-th area DCP1 overlapping the (1-1)-th pattern GSP1 and a (2-2)-th area DCP2 overlapping the (1-2)-th area GSP2. The (2-1)-th area DCP1 and the (2-2)-th area DCP2 may be disposed along the second direction (y).

In addition, the second signal wire DCL according to the embodiment may include a second connection area DCPC connecting the (2-1)-th area DCP1 and the (2-2)-th area DCP2. The second connection area DCPC may have a bar shape extending along the second direction (y)

The second signal wire DCP may overlap a portion of the first signal wire GSP. Particularly, the second signal wire DCP may overlap the (1-1)-th pattern GSP1 and the (1-2)-th pattern GSP2.

Each of the (2-1)-th area DCP1 and the (2-2)-th area DCP2 may include an extension having a wider width than that of a remainder of the second connection area DCPC. The second connection area DCPC overlapping an area in which the substrate SUB is folded may be formed to have a relatively small width along the folding axis direction, thereby preventing cracks or lifting of the second connection area DCPC. However, the shapes of the (2-1)-th area DCP1, the (2-2)-th area DCP2, and the second connection area DCPC are not limited thereto, and may be variously modified according to embodiments.

The second signal wire DCP may include the same material as the connection electrode CE (of FIG. 4) positioned in the display area DA. The second signal wire DCP may be formed through the same process as the connection electrode CE (of FIG. 4). However, the invention is not limited thereto, and the second signal wire DCP may be formed in the same process while including the same material as the source electrode SE (of FIG. 4) and the drain electrode DE (of FIG. 4).

The second signal wire DCP may be connected to the first signal wire GSP through the contact holes CNT of the second insulating layer ILD2. Specifically, the (2-1)-th area DCP1 may be electrically connected to the (1-1)-th pattern GSP1 through the contact hole CNT1. The (2-2)-th area DCP2 may be electrically connected to the (1-2)-th pattern GSP2 through the contact hole CNT2.

The third insulating layer ILD3 may be positioned on the second signal wire DCP and the second insulating layer ILD2. The third insulating layer ILD3 may include the same material as the third insulating layer ILD3 (of FIG. 4) positioned in the display area DA, and may be formed in the same process.

The third insulating layer ILD3 may expose at least a portion of the second signal wire DCP. Particularly, the third insulating layer ILD3 may expose the second connection area DCPC of the second signal wire DCP.

The metal layer AR may be positioned on the third insulating layer ILD3, the second signal wire DCP, and the second insulating layer ILD2. The metal layer AR may include a metal paste, a metal ink, a metal-organic decomposition (MOD), or a metal.

The metal layer AR may be positioned in the opening OP1 of the third insulating layer ILD3. The metal layer AR may have a convex upper surface depending on the material forming the metal layer AR, and may have a flat upper surface according to another embodiment.

The metal layer AR may contact the (2-1)-th area DCP1 and the (2-2)-th area DCP2 exposed by the third insulating layer ILD3. In addition, the metal layer AR according to the embodiment may be in contact with the second connection area DCPC exposed by the opening OP1. In an embodiment, the metal layer AR, together with the first signal wire GSP and the second signal wire DCP, may constitute a portion of a signal wire in the folding area FA (e.g., a folding area signal wire portion).

The resin layer BR may be positioned on the third insulating layer ILD3 and the metal layer AR. The resin layer BR may include an organic material or an inorganic material including at least one of an acryl-based compound, an epoxy-based compound, a urethane-based compound, a fluorine-based compound, and Si. The resin layer BR may be formed by using an inkjet process or a dispenser.

The resin layer BR may cover all of the plurality of first signal wires GSP, the plurality of second signal wires DCP, and the metal layer AR. The resin layer BR may be integrally formed while entirely covering the folding area FA. However, the invention is not limited thereto, and the resin layer BR may be formed separately into a plurality of areas.

In an embodiment, a folding area FA extends from the display area DA. And a signal wire is connected to the display layer DPL and extends across the folding area FA. The signal wire includes within the folding area FA, a first signal wire layer (e.g., the first signal wire GSP) including a plurality of patterns (e.g., the (1-1)-th pattern GSP1 and the (1-2)-th pattern GSP2) spaced apart from each other along the signal wire, a second signal wire layer (e.g., the second signal wire DCP) which is on the first signal wire layer, electrically connected to the first signal wire layer and crosses the folding area FA, and a metal layer AE which is on the second signal wire layer and electrically connected to the second signal wire layer.

According to the embodiment, a plurality of signal wire portions positioned in the folding area FA of the non-display area may be electrically connected to each other through the first signal wire GSP, the second signal wire DCP, and the metal layer AR. The first signal wire GSP has a separated shape in the folding area FA, but the second signal wire DCP connecting the spaced apart first signal wires GSP may cross the folding area FA, and the second signal wire DCP may be additionally connected by the metal layer AR. The first signal wire GSL and the second signal wire DCP may be electrically connected to each other by using the metal layer AR having relatively excellent flexibility. According to the embodiment, even when the substrate SUB is folded, cracks and lifts of the metal wires are prevented from being transmitted, and a dead space of the peripheral area may be reduced by folding the substrate SUB at a specific angle.

Referring to FIG. 11, the display device 1 according to the embodiment may further include the fourth insulating layer ILD4 positioned on the third insulating layer ILD3 in the folding area FA. The fourth insulating layer ILD4 may be formed in the same process while including the same material as the partition wall PDL (of FIG. 4) positioned in the display area DA. The fourth insulating layer ILD4 may include the opening OP2 exposing the metal layer AR The resin layer BR may be positioned in the opening OP2 of the fourth insulating layer ILD4. The opening OP2 of the fourth insulating layer ILD4 may prevent the resin from overflowing during the process of forming the resin layer BR.

Figure 12:
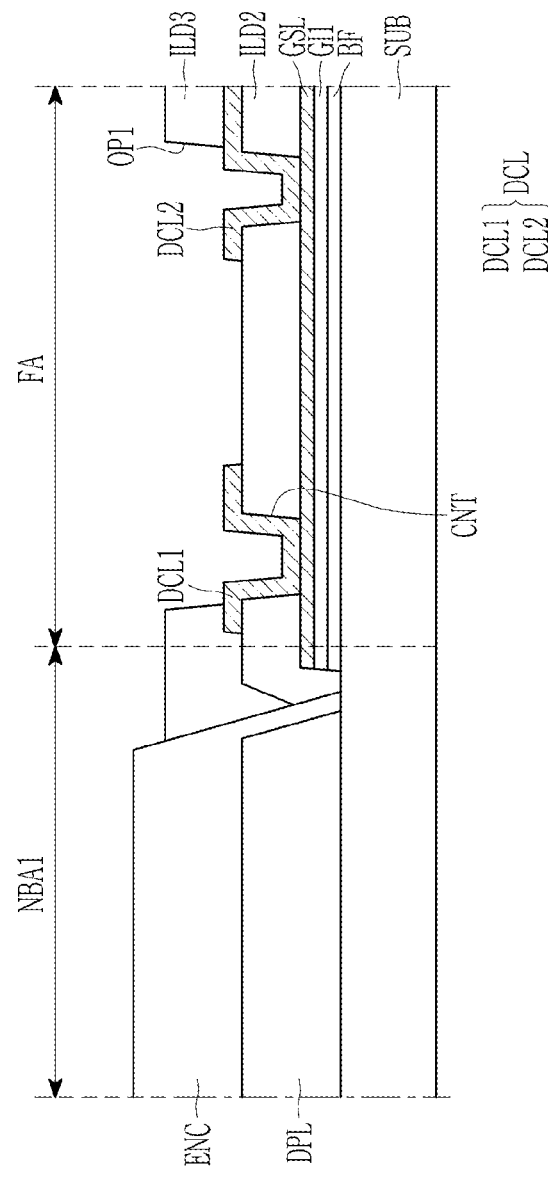
Figure 13:
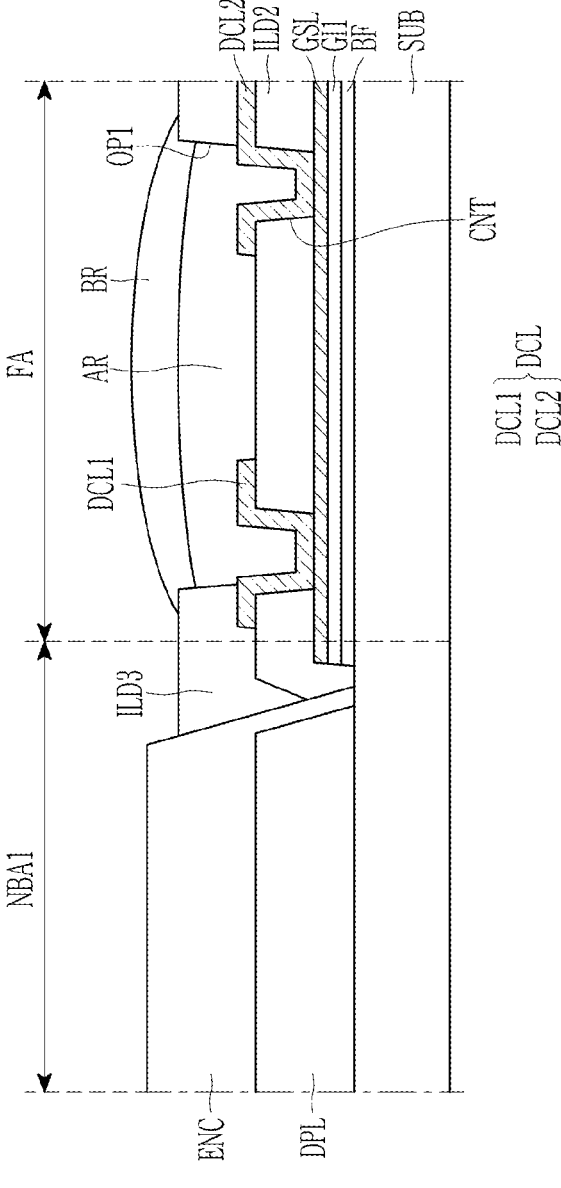
Figure 14:
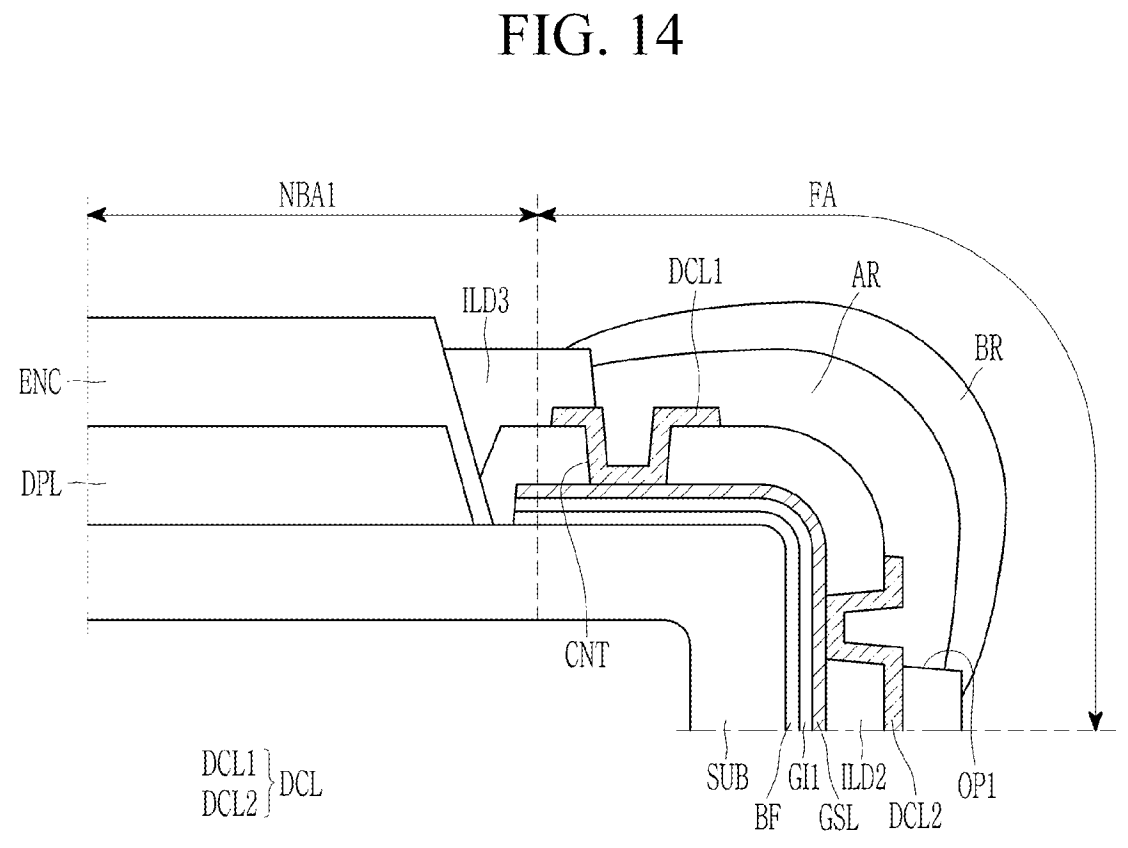

Hereinafter, a process of manufacturing (or providing) a display panel DP will be described with reference to FIG. 12 to FIG. 14. FIG. 12, FIG. 13, and FIG. 14 respectively illustrate cross-sectional views of a process of a display panel DP according to an embodiment.

First, referring to FIG. 12, the buffer layer BF, the first gate insulating layer GI1, and the first signal wire GSL, including portions both in the display area DA and in the non-display area NA (such as extending from the display area DA to the non-display area NA), are formed (or provided) on the substrate SUB overlapping the folding area FA. The second insulating layer ILD2 including portions both in the display area DA and in the non-display area NA, and defining the contact holes CNT, is formed on the first signal wire GSL, and then the second signal wire including the (2-1)-th pattern DCL1 and the (2-2)-th pattern DCL2 that are spaced apart from each other is formed. In this case, the substrate SUB may be maintained in a flat shape. That is, the display panel DP and/or the display device 1 may be disposed in a single plane, to be flat. Thereafter, the third insulating layer ILD3 including portions both in the display area DA and in the non-display area NA, is formed on the second signal wire DCL. The third insulating layer ILD3 may include (or define) the opening OP1 overlapping the folding area FA.

As shown in FIG. 13, the metal layer AR and the resin layer BR may be sequentially formed in the opening OP1.

Then, as shown in FIG. 14, the substrate SUB may be folded so that at least a portion of the substrate SUB overlaps the rear surface of another portion of the substrate SUB, as shown in FIG. 5. In this case, the signal wire crossing the folding area FA may include the first signal wire GSL, the second signal wire DCL, and the metal layer AR. Since the second signal wire DCL has a spaced apart shape in the folding area FA, folding of the display device 1 and/or the display panel DP, at the folding area, may be facilitated. In addition, the second signal wires DCL having the spaced apart shape may be electrically connected to each other through the highly flexible metal layer AR. Accordingly, a signal may be stably transmitted through a signal wire, without cracking or lifting of the signal wire in the folding area FA. In addition, the planar area of the display area DA may be expanded by reducing the dead space (e.g., a planar area of the non-display area NA which is visible in a display device 1 which is folded), through the folding of the substrate SUB.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a display area including a display layer;
a folding area extending from the display area and at which the display device is bendable; and
a signal wire which is connected to the display layer and extends across the folding area,
wherein the signal wire includes within the folding area:
a first signal wire layer which crosses the folding area,
a second signal wire layer which is on the first signal wire layer and electrically connected to the first signal wire layer, the second signal wire layer including a plurality of patterns spaced apart from each other along the signal wire,
a metal layer which is on the second signal wire layer and electrically connected to the second signal wire layer, and
a resin layer on the metal layer.

2. The display device of claim 1, wherein the first signal wire layer includes:
a (1-1)-th area adjacent to the display area,
a (1-2)-th area further from the display area than the (1-1)-th area, and
a connection area which connects the (1-1)-th area and the (1-2)-th area to each other.

3. The display device of claim 2, wherein a width of each of the (1-1)-th area and the (1-2)-th area is greater than a width of the connection area.

4. The display device of claim 2, wherein the (1-1)-th area, the connection area, and the (1-2)-th area are arranged along a same virtual line.

5. The display device of claim 2, wherein
a (2-1)-th pattern among the plurality of patterns of the second signal wire layer overlaps the (1-1)-th area of the first signal wire layer, and
a (2-2)-th pattern among the plurality of patterns of the second signal wire layer overlaps the (1-2)-th area of the first signal wire layer.

6. The display device of claim 5, wherein
the metal layer commonly overlaps the (2-1)-th pattern and the (2-2)-th pattern of the second signal wire layer which are spaced apart from each other.

7. The display device of claim 1, wherein within the folding area:
the first signal wire layer is provided in plural including a plurality of first signal wire layers,
the second signal wire layer is provided in plural including a plurality of second signal wire layers, and
the resin layer covers the plurality of the first signal wire layers and the plurality of the second signal wire layers.

8. The display device of claim 1, further comprising:
an insulating layer which is on the second signal wire layer and defines a first opening corresponding to the folding area,
wherein the metal layer and the resin layer are within the first opening of the insulating layer.

9. The display device of claim 8, wherein
the display layer includes:
a first electrode,
a partition wall defining a second opening which corresponds to the display area and exposes the first electrode to outside the partition wall,
a second electrode overlapping the first electrode, and a light emitting layer between the first electrode and the second electrode, and the insulating layer and the partition wall are respective portions of a same layer.

10. A display device comprising:

a display area including a display layer;

a folding area extending from the display area and at which the display device is bendable; and a signal wire which is connected to the display layer and extends across the folding area, wherein the signal wire includes within the folding area:

a first signal wire layer including a plurality of patterns spaced apart from each other along the signal wire, a second signal wire layer which is on the first signal wire layer, electrically connected to the first signal wire layer and crosses the folding area, a metal layer which is on the second signal wire layer and electrically connected to the second signal wire layer, and a resin layer on the metal layer.

11. The display device of claim 10, wherein the second signal wire layer includes:

a (2-1)-th area adjacent to the display area, a (2-2)-th area adjacent further from the display area than the (2-1)-th area, and a connection area which connects the (2-1)-th area and the (2-2)th area to each other.

12. The display device of claim 11, wherein a width of each of the (2-1)-th area and the (2-2)-th area is greater than a width of the connection area.

13. The display device of claim 11, wherein the (2-1)-th area of the second signal wire layer overlaps a (1-1)-th pattern among the plurality of patterns of the first signal wire layer, and the (2-2)-th area of the second signal wire layer overlaps a (1-2)-th pattern among the plurality of patterns of the first signal wire layer.

14. The display device of claim 13, wherein the metal layer overlaps the connection area of the second signal wire layer.

15. The display device of claim 10, wherein within the folding area:

the first signal wire layer is provided in plural including a plurality of first signal wire layers, the second signal wire layer is provided in plural including a plurality of second signal wire layers, and the resin layer covers the plurality of the first signal wire layers and the plurality of the second signal wire layers.

16. The display device of claim 10, further comprising:

an insulating layer which is on the second signal wire layer and defines a first opening corresponding to the folding area, wherein the metal layer and the resin layer are within the first opening of the insulating layer.

17. The display device of claim 16, wherein the display layer includes:

a pixel circuit comprising:

a gate electrode, a source electrode and a drain electrode which are on the gate electrode, and a connection electrode which is on the drain electrode, and a light-emitting element connected to the pixel circuit, the light-emitting element comprising:

a first electrode, on the connection electrode, a partition wall defining a second opening which exposes the first electrode to outside the partition wall, a second electrode of the light-emitting element, overlapping the first electrode, at the second opening, and a light emitting layer between the first electrode and the second electrode, at the second opening.

18. The display device of claim 17, wherein the first signal wire layer is in a same layer as the gate electrode, and the second signal wire layer is in a same layer as the connection electrode.

\* \* \* \* \*